United States Patent
Theuss et al.

(10) Patent No.: US 7,557,417 B2
(45) Date of Patent: Jul. 7, 2009

(54) MODULE COMPRISING A SEMICONDUCTOR CHIP COMPRISING A MOVABLE ELEMENT

(75) Inventors: Horst Theuss, Wenzenbach (DE); Bernd Stadler, Donaustauf (DE)

(73) Assignee: Infineon Technologies AG, Munich (DE)

(*) Notice: Subject to any disclaimer, the term of this patent is extended or adjusted under 35 U.S.C. 154(b) by 129 days.

(21) Appl. No.: 11/709,337

(22) Filed: Feb. 21, 2007

(65) Prior Publication Data
US 2008/0197485 A1      Aug. 21, 2008

(51) Int. Cl.
*H01L 29/40* (2006.01)
(52) U.S. Cl. .................. 257/415; 257/777
(58) Field of Classification Search .......... 257/415, 257/419, 678, 777; 438/50
See application file for complete search history.

(56) References Cited

U.S. PATENT DOCUMENTS

| | | | |
|---|---|---|---|
| 7,213,465 B2 | 5/2007 | Benzel et al. | |
| 7,327,004 B2 * | 2/2008 | Hattori et al. | 257/415 |
| 2005/0186703 A1 | 8/2005 | Weiblen et al. | |
| 2005/0218488 A1 | 10/2005 | Matsuo | |
| 2007/0259470 A1 | 11/2007 | Quenzer et al. | |

FOREIGN PATENT DOCUMENTS

| | | |
|---|---|---|
| DE | 600 03 199 T2 | 7/2004 |
| DE | 103 24 421 A1 | 1/2005 |
| DE | 103 47 215 A1 | 5/2005 |
| DE | 10 2004 003 413 A1 | 8/2005 |
| DE | 10 2005 001 449 B3 | 7/2006 |
| WO | WO 2005/040747 A1 | 5/2005 |

* cited by examiner

*Primary Examiner*—Roy K Potter
(74) *Attorney, Agent, or Firm*—Slater & Matsil, L.L.P.

(57) ABSTRACT

The invention relates to a module comprising a carrier, a first semiconductor chip applied to the carrier and having a movable element and a second semiconductor chip applied to the first semiconductor chip, wherein an active first main surface of the first semiconductor chip faces the carrier and a first cavity is formed between the two semiconductor chips.

29 Claims, 2 Drawing Sheets

MODULE COMPRISING A SEMICONDUCTOR CHIP COMPRISING A MOVABLE ELEMENT

The invention relates to a module comprising a semiconductor chip comprising a movable element. The invention furthermore relates to a method for producing a module of this type.

Particular requirements have to be taken into consideration in the development of housings for semiconductor chips which contain movable elements. By way of example, it may be necessary to create cavities in which the movable elements are positioned.

Against this background, a module in accordance with the independent claims 1, 14, 15, 21 and 25 and also a method in accordance with the independent claim 16 are specified. Advantageous developments and configurations are specified in the subclaims.

In accordance with one configuration, a module comprises a carrier, a first semiconductor chip applied to the carrier and a second semiconductor chip applied to the first semiconductor chip. The first semiconductor chip has a movable element and an active first main surface of the first semiconductor chip faces the carrier. A first cavity is formed between the first and the second semiconductor chip.

In accordance with a further configuration, a module comprises a first semiconductor chip comprising a movable element, a second semiconductor chip applied to the first semiconductor chip, and a shielding element applied to the second semiconductor chip. A first cavity is formed between the first and the second semiconductor chip.

In accordance with a further configuration, a module comprises a carrier, a first semiconductor chip applied to the carrier and a second semiconductor chip applied to the first semiconductor chip. The second semiconductor chip has a movable element. A first cavity is formed between the first and the second semiconductor chip.

BRIEF DESCRIPTION OF THE DRAWINGS

The invention is explained in more detail below in an exemplary manner with reference to the drawings, in which.

DETAILED DESCRIPTION OF ILLUSTRATIVE EMBODIMENTS

Modules comprising semiconductor chips comprising movable elements and also methods for producing the modules are described below. The invention is independent of the type of semiconductor chip and movable element. The movable elements may be for example mechanical elements, sensors or actuators and may be configured for example as microphones, acceleration sensors, pressure sensors or light generating elements. A semiconductor chip into which a movable element is embedded may comprise electronic circuits which for example drive the movable element or further process signals generated by the movable element. The movable elements may, in the same way as the semiconductor chips, be produced from semiconductor materials, but also from other materials, such as e.g. plastics. In the literature, combinations of mechanical elements, sensors or actuators with electronic circuits in a semiconductor chip are often referred to as MEMS (Micro-Electro-Mechanical System).

One or a plurality of elements of the module, such as, for example, one or a plurality of semiconductor chips, connecting lines or shielding elements, may be constructed on a carrier. The carrier may e.g. be produced on a semiconductor basis or be fabricated from some other material, e.g. a ceramic substrate, glass substrate, polymer or PCB. The carrier may also be a leadframe produced from copper, for example.

In accordance with one configuration, the modules comprise shielding elements. A shielding element may serve for example to suppress or to reduce electromagnetic radiation or electromagnetic fields and/or the propagation thereof. The suppression or reduction of the electromagnetic interference may relate to specific spatial directions or be relative to specific frequencies. A shielding element may be produced e.g. from an electrically conductive material, for example a metal or an alloy or a conductive polymer. A shielding element may also be an electrically conductive coating of a body that is otherwise not electrically conductive. The shielding element may be arranged e.g. in the vicinity of a component that is to be protected against electromagnetic interference. The shielding element may for example encapsulate the component. Under certain circumstances, a complete encapsulation of the component by the shielding element is not necessary since shielding along one or a plurality of spatial directions is already sufficient. The shielding element may also be arranged in the vicinity of a component that generates an electromagnetic interference radiation. It is thereby possible to suppress or reduce the emission of the interference radiation to the surroundings.

Figure 1:
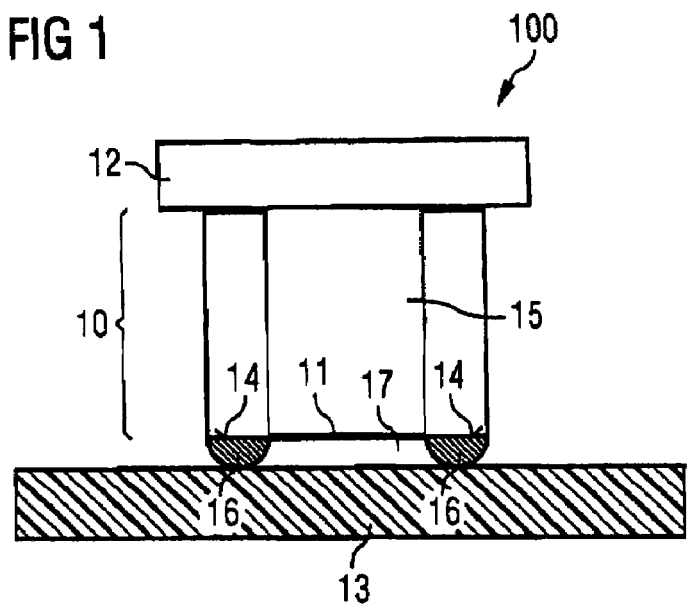
FIG. 1 shows a schematic illustration of a module 100 as an exemplary embodiment of the invention.

FIG. 1 illustrates a module 100 in cross section as an exemplary embodiment of the invention. The module 100 comprises a semiconductor chip 10 comprising a movable element 11, a semiconductor chip 12 and a carrier 13. The semiconductor chip 111 is mounted onto the carrier 13 by its active main surface 14, on which electrically operable structures are situated. The semiconductor chip 12 is stacked onto the semiconductor chip 10 in such a way that a cutout of the semiconductor chip 10 in which the movable element 11 is situated is covered by the semiconductor chip 12. A cavity 15 is thereby created between the semiconductor chips 10 and 12.

The movable element 11 may be for example a mechanical element, such as e.g. a diaphragm, a sensor or an actuator. Together with the movable element 11, the semiconductor chip 10 may for example form an MEMS and be configured as a microphone, acceleration sensor or pressure sensor.

In accordance with one configuration, the movable element 11 is situated essentially at the level of the active main surface 14 of the semiconductor chip 10. A cutout has been introduced into the rear side of the semiconductor chip 10 for example by means of material removal, e.g. by means of an etching process, said cutout reaching as far as the movable element 11 at the level of the active main surface 14. The movable element 11 is uncovered as a result.

In accordance with a further configuration, the semiconductor chip 10 is fixed on the carrier 13 by means of solder balls 16. The movable element 11 is spaced apart from the surface of the carrier 13 by the solder balls 16 or, if appropriate, alternative spacers, such that a cavity 17 is formed between the movable element 11 and the carrier 13. One advantage of the module 100 shown in FIG. 1 is that the two cavities 15 and 17 are created in a space-saving manner on account of the stacking of the semiconductor chips 10 and 12.

Figure 2:
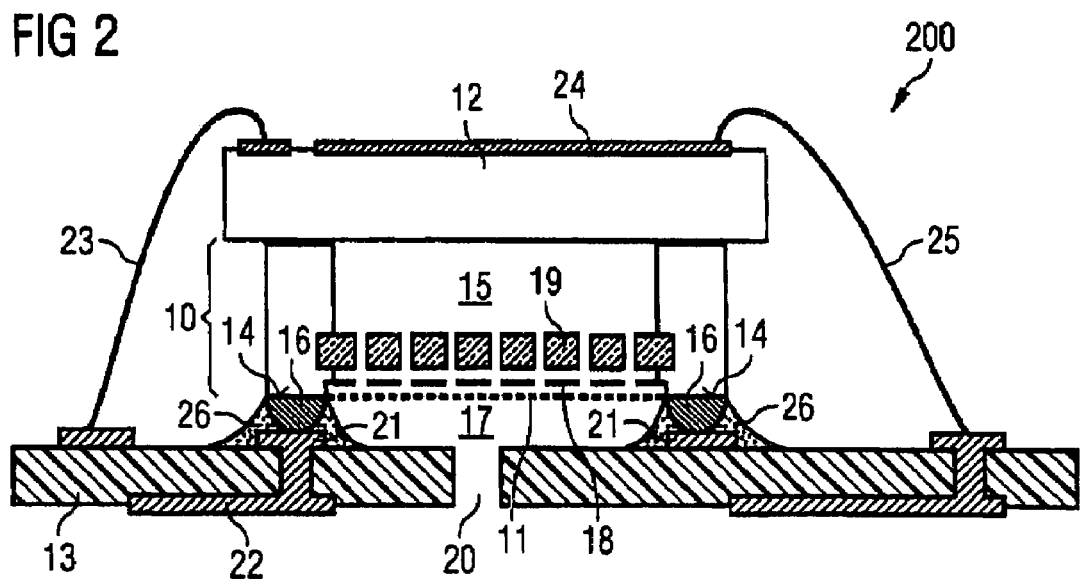
FIG. 2 shows a schematic illustration of a module 200 as a further exemplary embodiment of the invention.

FIG. 2 shows a module 200, which represents a development of the module 100 shown in FIG. 1. In the case of the module 200, the semiconductor chip 10 is formed together with the movable element 11 as a microphone. In the present case, the movable element 11 is a diaphragm 11, which can be excited to effect vibrations by sound waves. The vibrations of the diaphragm 11 are measured capacitively by means of a further diaphragm 18 arranged above the diaphragm 11. The diaphragm 11 has for example a thickness in the range of 200 to 300 nm, while the diaphragm 18 operating as a counter electrode has a thickness in the range of 750 to 850 nm. A perforated layer 19 may furthermore be arranged above the diaphragm 18.

The perforated layer 19 is required for producing the diaphragm 11. The perforated layer 19 is produced by introducing channels into the semiconductor chip 10 from the active main surface 14 by means of an isotropic trench process. The diaphragm 18 lying above the layer 19 is likewise perforated during this trench process. A sacrificial oxide layer is subsequently deposited on the diaphragm 18, the diaphragm 11 being applied to said sacrificial oxide layer. On the rear side of the semiconductor chip 10, the silicon material is removed in the region of the cavity 15 down to the layer 19 by means of bulk micromachining techniques. A wet-chemical etchant can be introduced into the channels of the layer 19 that are now accessible from the rear side of the semiconductor chip 10, which etchant strips out the sacrificial oxide layer such that a cavity is formed between the diaphragms 11 and 18.

On account of the configuration of the semiconductor chip 10 as a microphone, the carrier 13 has an opening 20 leading to the cavity 17. Sound waves can pass from the outside to the diaphragm 11 via the opening 17.

As has already been described above, the rear side of the semiconductor chip 10 has been uncovered in the region of the perforated layer 19. The cavity 15 arises a result of this cutout being covered with the semiconductor chip 12, said cavity serving as an acoustic back volume for the microphone. Back volume denotes an enclosed air space that prevents an acoustic short circuit—an undesired pressure equalization between front side and rear side of the vibrating diaphragm 11. Upon each deflection of the diaphragm 11, this air volume brings about a restoring force in addition to the restoring force caused by the elastic diaphragm properties. On account of the perforation of the diaphragm 18 and the layer 19, the air volume of the cavity 15 is coupled to the diaphragm 11. In accordance with one configuration, the volume of the cavity 15 is about 3.0 to 3.5 mm³.

The semiconductor chip 10 is arranged in flip-chip position on the carrier 13 and is mechanically and electrically connected to the carrier 13 by means of the solder balls 16. The solder balls 16 are applied on contact areas 21 of the carrier 13 which are connected by means of via connections to contact areas 22 arranged on the other side of the carrier 13. Contact can be made with the semiconductor chip 10 externally by means of the contact areas 22.

The semiconductor chip 12 can be fixed on the semiconductor chip 10 by means of an adhesive, for example. Furthermore, spacers can be arranged between the two semiconductor chips 10 and 12. The volume of the cavity 15 is increased further as a result. The active main surface of the semiconductor chip 12 is oriented upward in the case of the module 200. The semiconductor chip 12 is electrically connected to the carrier 13 by means of connecting lines 23, e.g. bonding wires.

Furthermore, a shielding element 24 is arranged on the top side of the semiconductor chip 12. The shielding element 24 serves for at least partly shielding electromagnetic radiation. In this case, it may be provided, for example, that the semiconductor chip 12 is protected by the shielding element 24 against electromagnetic interference radiation generated by a radiation source situated within or outside the module 200. Furthermore, the electromagnetic radiation may for example also be generated by the semiconductor chip 12 itself. In this case, the shielding element 24 prevents interference with further components by the radiation emitted by the semiconductor chip 12.

Appropriate materials for the shielding element 24 are metals, such as e.g. aluminum, copper, iron or gold, or alloys or electrically conductive polymers or graphite. In the present exemplary embodiment, the shielding element 24 is formed as an electrically conductive layer 24, which is deposited e.g. on a passivation layer on the semiconductor chip 12. The layer 24 covers the surface of the semiconductor chip 12 only partly, for example, and has a patterning in order to keep free the contact elements of the semiconductor chip 12. Furthermore, the layer 24 is connected to the carrier 13 by means of a connecting line 25. A fixed electrical potential, e.g. ground, can be applied to the layer 24 by means of the connecting line 25, which may be a bonding wire, for example, which is connected to the layer 24 by means of a welding contact.

The semiconductor chip 12 may serve for example to take up signals generated by the semiconductor chip 10 and to process them further and/or to control the semiconductor chip 10. The semiconductor chip 12 may be an ASIC (Application Specific Integrated Circuit) specifically designed for its application with regard to the further processing of the microphone signals and/or the driving of the semiconductor chip 10.

The cavity 15 is sufficiently sealed by the adhesive bonding of the semiconductor chip 12 on the semiconductor chip 10. The cavity 17 can be sealed in the region of the solder balls 16 by means of a dispensed adhesive 26 or a structured adhesive tape.

If sufficient sealing of the cavities 15 and 17 is ensured, a potting material, for example plastic or globe top or Turboplast, can be applied to the top side of the carrier 13 and to the components arranged thereon. The application of the potting material makes it possible to create a housing that encapsulates the components of the module 200 and leaves only the underside of the carrier 13 free.

Figure 3:
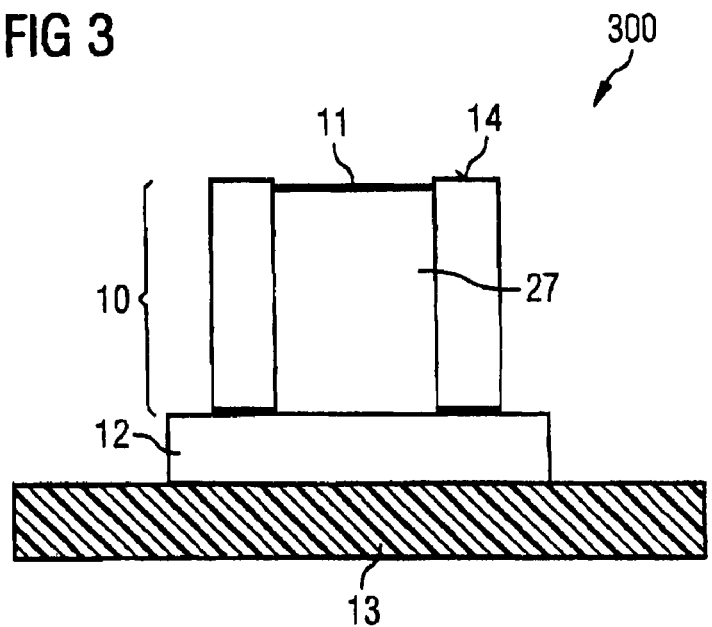
FIG. 3 shows a schematic illustration of a module 300 as a further exemplary embodiment of the invention.

FIG. 3 illustrates a module 300 in cross section as further exemplary embodiment of the invention, in the case of which module the semiconductor chip 12 is mounted onto the carrier 13 and the semiconductor chip 10 comprising the movable element 111 is stacked onto the semiconductor chip 12. A cavity 27 is formed between the two semiconductor chips 10 and 12. The semiconductor chips 10 and 12 may have the configurations described in connection with FIGS. 1 and 2.

In accordance with one configuration, the active main surface 14 of the semiconductor chip 10 is oriented upward. The cavity 27 is accordingly formed by the cutout in the semiconductor chip 10 below the movable element 11. The cavity 27 required for the operation of the movable element 11 is created in a space-saving manner by means of the stacking of the semiconductor chips 10 and 12 as shown in FIG. 3.

Figure 4:
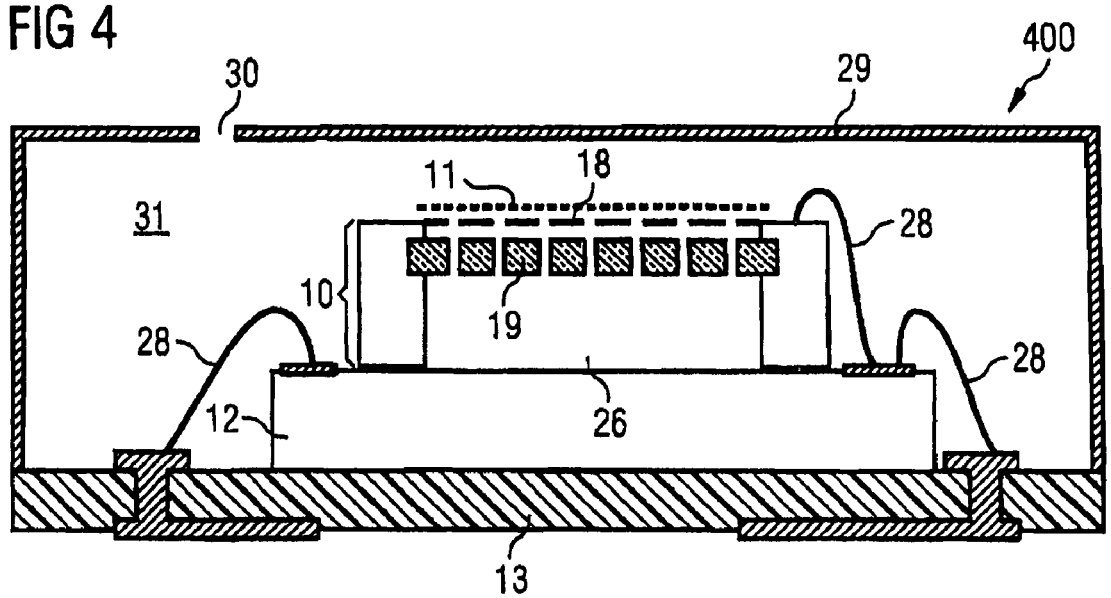
FIG. 4 shows a schematic illustration of a module 400 as a further exemplary embodiment of the invention.

FIG. 4 shows a module 400, which represents a development of the module 300 shown in FIG. 3. In the case of the module 400, the semiconductor chip 10 is formed together with the movable element 11 as a microphone. The configuration of the semiconductor chip 10 corresponds to the configuration in accordance with FIG. 2.

In the case of the module 400, the active main surfaces of both semiconductor chips 10 and 12 are oriented upward and connected to the carrier 13 by means of bonding wires 28.

In accordance with one configuration, a housing 29 is arranged on the carrier 13, which housing encapsulates components applied on the top side of the carrier 13. In order that sound waves can pass to the diaphragm 11, an opening 30 is introduced into the housing 29. A further cavity 31 is formed between the housing 29 and the diaphragm 11, said further cavity being required for the operation of the diaphragm 11 as part of a microphone.

In accordance with a further configuration, the housing 29 additionally serves as a shielding element for shielding electromagnetic radiation. For this purpose, the housing 29 may be fabricated from an electrically conductive material, e.g. a metal or an alloy, or be at least coated with an electrically conductive material.

The invention claimed is:

1. A module comprising:
   a carrier;
   a first semiconductor chip comprising a movable element and an active first main surface of the first semiconductor chip, said active first main surface mounted onto and facing the carrier; and
   a second semiconductor chip applied to the first semiconductor chip, wherein a first cavity is formed between the two semiconductor chips.

2. The module according to claim 1, wherein a second cavity is formed between the first semiconductor chip and the carrier.

3. The module according to claim 2, wherein the carrier has an opening leading to the second cavity.

4. The module according to claim 1, wherein the movable element of the first semiconductor chip comprises at least one diaphragm.

5. The module according to claim 4, wherein the at least one diaphragm is arranged in a region of the active first main surface of the first semiconductor chip.

6. The module according to claim 4, wherein a second main surface of the first semiconductor chip has a cutout extending as far as the at least one diaphragm.

7. The module according to claim 4, wherein a microphone is integrated into the first semiconductor chip and the microphone comprises the at least one diaphragm.

8. The module according to claim 1, wherein a contact region between the first semiconductor chip and the carrier is sealed, in particular by an adhesive and/or an adhesive tape.

9. The module according to claim 1, wherein the two semiconductor chips are at least partly covered with a potting material.

10. The module according to claim 1, wherein a shielding element is applied to the second semiconductor chip.

11. The module according to claim 10, wherein the shielding element is an electrically conductive layer with which a second component is at least partly coated.

12. The module according to claim 1, wherein the second semiconductor chip is designed to process signals generated by the first semiconductor chip and/or to control the first semiconductor chip.

13. A module comprising:
    a carrier;
    a first semiconductor chip applied to the carrier and having at least one diaphragm wherein an active main surface of the first semiconductor chip faces the carrier and a first cavity is formed between the carrier and the first semiconductor chip; and
    a second semiconductor chip applied to the first semiconductor chip, wherein a second cavity is formed between the two semiconductor chips and the at least one diaphragm is arranged between the first and the second cavity.

14. A module comprising:
    a carrier;
    a first semiconductor chip applied to the carrier, wherein the first semiconductor chip comprises a movable element and an active main surface of the first semiconductor chip faces the carrier;
    a second semiconductor chip applied to the first semiconductor chip, wherein a first cavity is formed between the two semiconductor chips; and
    an electrically conductive layer which at least partly covers a surface of the second semiconductor chip.

15. A method comprising:
    providing a carrier, a first semiconductor chip comprising a movable element and a second semiconductor chip;
    mounting an active first main surface of the first semiconductor chip onto and facing the carrier; and
    applying the second semiconductor chip to the first semiconductor chip, such that a first cavity is formed between the two semiconductor chips.

16. The method according to claim 15, wherein a second cavity is formed between the first semiconductor chip and the carrier.

17. The method according to claim 16, wherein an opening leading to the second cavity is introduced into the carrier.

18. The method according to claim 15, wherein the movable element is produced by etching a second main surface lying opposite the active first main surface.

19. The method according to claim 18, wherein a cutout is introduced into the second main surface.

20. A module comprising:
    a first semiconductor chip comprising an active main surface and a movable element that moves in a direction perpendicular to said active main surface; and
    a second semiconductor chip applied to the first semiconductor chip, wherein a first cavity is formed between the two semiconductor chips.

21. The module according to claim 20, wherein the first semiconductor chip is applied to a carrier and a second cavity is formed between the first semiconductor chip and the carrier.

22. The module according to claim 20, wherein the carrier has an opening leading to the second cavity.

23. A module comprising:
    a first semiconductor chip comprising a first surface and a movable element;
    a second semiconductor chip comprising a first surface over the first surface of the first semiconductor chip wherein a first cavity is formed between the movable element of the first semiconductor chip and the first surface of the second semiconductor chip; and
    an electrical shielding element mounted onto a second surface of the second semiconductor chip opposite the first surface of the second semiconductor chip.

24. A module comprising:
    a carrier;
    a first semiconductor chip attached to the carrier; and
    a second semiconductor chip attached to the first semiconductor chip, wherein the second semiconductor chip comprises an active main surface and a movable element that moves in a direction perpendicular to said active main surface, and such that a first cavity is formed between the two semiconductor chips.

25. The module according to claim 24, wherein a housing is applied to the carrier and the two semiconductor chips are arranged in a second cavity formed by the carrier and the housing.

26. The module according to claim 24, wherein the housing has an opening.

27. The module according to claim 24, wherein the housing is at least partly electrically conductive.

28. The module of claim 1 wherein said movable element moves perpendicular to said active first main surface.

29. The module according to claim 23, wherein the shielding element is an electrically conductive layer with which the second semiconductor chip is at least partly coated.

* * * * *